United States Patent [19]

Sell

[11] Patent Number: 5,047,761
[45] Date of Patent: Sep. 10, 1991

[54] POINTER ILLUMINATED INSTRUMENT

[75] Inventor: Gerhard Sell, Schwalbach/Ts., Fed. Rep. of Germany

[73] Assignee: VDO Adolf Schindling AG, Frankfurt am Main, Fed. Rep. of Germany

[21] Appl. No.: 447,925

[22] Filed: Dec. 8, 1989

[30] Foreign Application Priority Data

Feb. 16, 1989 [DE] Fed. Rep. of Germany ....... 3904657

[51] Int. Cl.$^5$ ...................... G01D 11/28; F21V 21/00
[52] U.S. Cl. ................................ 340/815.1; 116/288; 362/28; 362/30
[58] Field of Search ............... 116/288, 310; 340/815.01, 815.03, 815.1; 73/431; 362/29, 26, 28, 30, 32

[56] References Cited

U.S. PATENT DOCUMENTS

| | | | |
|---|---|---|---|
| 3,216,394 | 11/1965 | Blackwell | 362/26 X |
| 3,267,598 | 8/1966 | Olesen et al. | 340/815.1 |
| 3,641,967 | 2/1972 | Charbonneaux | 116/288 |
| 3,740,570 | 6/1973 | Kaelin et al. | 340/704 X |
| 3,754,243 | 8/1973 | Kaneko et al. | 340/815.06 |
| 3,873,979 | 3/1975 | Craford et al. | 340/815.03 |
| 3,918,053 | 11/1975 | Towne et al. | 340/815.03 |
| 4,044,708 | 8/1977 | Klein | 362/29 X |
| 4,163,428 | 8/1979 | Ishikawa | 362/29 X |
| 4,252,078 | 2/1981 | Fukasawa et al. | 116/288 |
| 4,257,084 | 3/1981 | Reynolds | 362/31 |
| 4,700,025 | 10/1987 | Hatayama et al. | 340/815.1 X |
| 4,882,659 | 11/1989 | Gloudemans | 362/30 |

FOREIGN PATENT DOCUMENTS 0078372 5/1983 European Pat. Off. .
3139004 5/1982 Fed. Rep. of Germany .
3331724 3/1985 Fed. Rep. of Germany .

OTHER PUBLICATIONS

"Trends bei LEDs und Vergleich mit anderen Anzeigearten", Der Electroniker, (Klaus Gillessen), pp. 51–55, (Optoelektronik), 7/84.

Primary Examiner—Daniel M. Yasich
Attorney, Agent, or Firm—Martin A. Farber

[57] ABSTRACT

In a pointer instrument, a light guide (3) serves as support for electronic components (7). The light guide (3) therefore assumes the function of a printed circuit board. The electronic components (7) are preferably arranged on the outer wall surface (6) of the light guide (3) which is developed in the shape of a conical frustum so that space which is in any event present in the housing can be used for them. The light guide serves to illuminate a dial of the instrument.

6 Claims, 1 Drawing Sheet

POINTER ILLUMINATED INSTRUMENT

FIELD AND BACKGROUND OF THE INVENTION

The present invention relates to a pointer instrument having a light guide for illuminating a dial, and having electronic components, particularly components of a measurement mechanism, arranged on a support.

Such pointer instruments are present in modern motor vehicles and are therefore generally known.

In the known pointer instruments, a printed circuit board is provided as support for the electronic components. The board is located between the measurement mechanism and the light guide. Since the space available on the instrument panel of a motor vehicle is limited, it is generally necessary to construct the pointer instruments which are to be installed in it, and of course all other components in as compact a manner as possible.

SUMMARY OF THE INVENTION

It is an object of the invention so to develop a pointer instrument of the aforementioned type so that it can be manufactured as compact as possible and at the lowest possible price.

According to the invention, the light guide (e.g., 3) on the side thereof facing away from the dial (e.g., 4) forms the support for the electronic components (e.g., 7).

By this development, space for a printed circuit board is saved. In this way, the pointer instrument can be made flatter than the prior-art pointer instruments. At the same time, it can be produced at lower cost, due to the absence of one component.

In a pointer instrument in which the light guide is developed in the shape of a conical frustum, one particularly advantageous embodiment of the invention provides that the electronic components (7) are arranged on the outer wall surface (6) of the light guide (3). By this feature, the space which is in any event present between the housing and the outer wall surface which forms the inclined deflection surface is used in suitable manner for the electronic components so that the pointer instrument is particularly compact.

If the number of components to be provided is large and the space on the outer wall surface is not sufficient, it is advantageous for flat electronic components (9) to be arranged on a circular surface (8) of the light guide (3) which faces away from the dial (4), and for the other components (7) to be arranged on the outer wall surface (6).

The electrical connection of the electronic components can be effected in the same way, as in the case of printed circuit boards, if the conductive paths (12) of the electronic components (7, 9) are also provided on the light guide (3).

In the case of pointer instruments it is frequently desirable for them to be illuminated in different colors in order to signal given conditions of travel to the driver. The tachometer can light up red, for instance, in the case of high speeds of travel and green in the case of low speeds. This can be achieved in particularly simple manner if at least one light-emitting diode (10, 11) which lights up, depending on the manner in which it is controlled in at least two different colors, is provided in the light guide (3).

A particularly uniform illumination and the possibility of obtaining a large number of different colors results if two light-emitting diodes (10, 11) are provided in the light guide (3) within its circular surface (8). Depending upon the manner in which they are controlled, the two light-emitting diodes light up in at least two different colors.

BRIEF DESCRIPTION OF THE DRAWING

With the above and other objects and advantages in view, the present invention will become more clearly understood in connection with the detailed description of preferred embodiments, when considered with the accompanying drawing, of which

DETAILED DESCRIPTION OF THE PREFERRED EMBODIMENT

Figure 1:
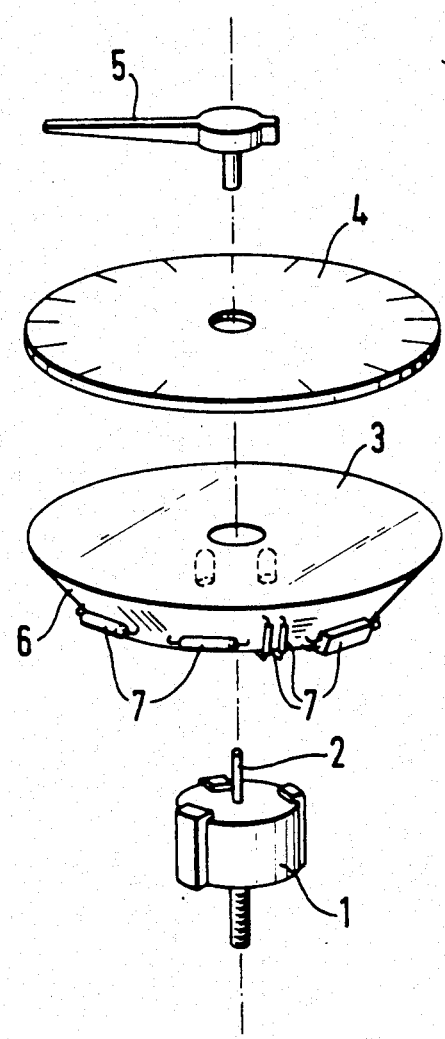
FIG. 1 is an exploded view of a pointer instrument, without housing, developed in accordance with the invention.

FIG. 1 shows a measurement movement which consists, for instance, of a rotary-magnet ratio-measurement movement. The measurement movement 1 has a measurement-movement shaft 2 which, in the assembled condition of the pointer instrument, passes through a light guide 3 having the shape of a conical disk and through a dial 4 so that a pointer 5 can be mounted on it.

Due to its shape as a conical disk, the light guide 3 has a conically extending outer surface 6 on which electronic elements 7 are arranged. There are considered in this connection measurement-movement electronic devices, for instance, components for the control of an instrument illumination or warning light arranged in the instrument. By way of example, control of light-emitting diodes is disclosed in "Der Electroniker", 7/84, "Trends bei LEDs und Vergleich mit anderen Anzeigearten", page 53. FIG. 1 does not show the conductive paths of the components 7 which are also provided on the light guide 3 and, for instance, can be applied by coating.

Figure 2:
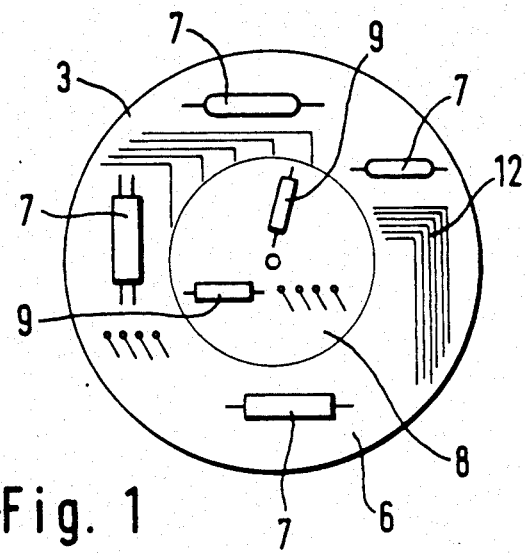
FIG. 2 is a bottom view of the light guide of the indicator instruments.

FIG. 2 shows a bottom view of the light guide 3 with the electronic components 7. FIG. 2 furthermore shows that electronic components 9 can also be arranged on the circular surface 8 of the light guide 3. In order however to keep the structural size of the pointer instrument as small as possible, flat components 9 are preferably arranged there, while the higher components are arranged on the outer wall surface 6. Conductive paths 12 provided on the light guide 3 are also shown in FIG. 2.

Figure 3:
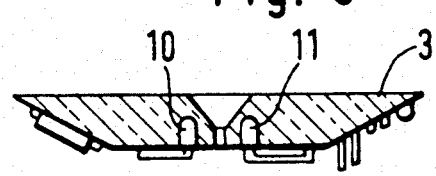
FIG. 3 is a horizontal section through the light guide.

In FIG. 3 it can be seen that two light-emitting diodes 10, 11 can be arranged in the light guide 3. These diodes are so developed that they light up in different colors, depending on the control applied to them.

I claim:

1. A pointer instrument comprising
    a dial, a pointer moveable about the dial for providing an indication thereon, and a light guide for illuminating the dial with light from a source of light, a surface of the light guide enclosing the light source and facing the dial for directing light from the source of light toward the dial;
    a measurement mechanism including electronic components and a shaft, the shaft passing through the light guide for operating the pointer for providing the indication on the dial; and wherein at least one surface of the light guide, facing away from the dial, serves as a support for the electronic components.

2. An instrument according to claim 1, wherein the surface of the light guide includes an outer wall surface; and the electronic components are located on the outer wall surface of the light guide.

3. An instrument according to claim 2, wherein at least one of said electronic components is a flat component;

the surface of the light guide furthermore has a circular surface;

said flat electronic component is located on the circular surface of the light guide; and other ones of said components are arranged on said outer wall surface of the light guide, said outer wall surface extending from said circular surface toward said dial.

4. An instrument according to claim 1, further comprising conductive paths for interconnecting the electronic components, the conductive paths being located on said surface of the light guide.

5. A pointer instrument comprising:

a dial, a pointer, a source of light comprising light-emitting diode means, and a light guide for illuminating the dial with light from the light source, the pointer being moveable about the dial to provide an indication on the dial;

a measurement mechanism having electronic components for providing the indication on the dial, the light guide being located between the measurement mechanism and the pointer, the measurement mechanism having a shaft intending through the light guide to operate the pointer; and wherein said light guide comprises a circular portion, and a wall portion extending from the circular portion toward said dail, said guide having a surface facing said light source and said dial for directing light from said light source toward said dial, said guide having an outer circular surface on said circular portion, said guide having an outer wall surface on said wall portion; and said light guide serves as a support for said components, said measurement instrument having conductive paths of the components wherein the conductive paths are mounted on said outer circular surface of said guide and on said outer wall surface of said guide, one of said components having a flat configuration and being mounted on said outer circular surface of said guide, and another of said components being mounted on said outer wall surface.

6. A pointer instrument comprising:

a dial, a source of light, and a light guide for illuminating the dial with light from the light source;

a measurement mechanism including electronic components for providing an indication on the dial and for activating the light source to provide light;

conductive paths for interconnecting the electronic components;

a pointer and a shaft, said light guide lying between said pointer and said measurement mechanism, said shaft passing through the light guide for operatively coupling the pointer to the measurement mechanism to provide said indication on said dial; and wherein said light guide comprises a circular portion, and a wall portion extending from the circular portion toward said dial, said guide having a surface enclosing said light source and facing said dial for directing light from said light source toward said dial, said guide having an outer circular surface on said circular portion, said guide having an outer wall surface on said wall portion; and said light guide serves as a support for said light source and said components and said conductive paths, one of said components having a flat configuration and being mounted on said outer circular surface of said guide, and another of said components being mounted on said outer wall surface.

* * * * *